United States Patent [19]
Mori

[11] Patent Number: 4,500,167
[45] Date of Patent: Feb. 19, 1985

[54] OPTICAL ENERGY COLLECTING AND TRANSMITTING APPARATUS USING TUBULAR LIGHT TRANSMITTING ELEMENT

[76] Inventor: Kei Mori, 3-16-3-501, Kaminoge, Setagaya-ku, Tokyo, Japan

[21] Appl. No.: 441,705

[22] Filed: Nov. 15, 1982

[30] Foreign Application Priority Data

Nov. 14, 1981 [JP] Japan .................. 56-182781
Nov. 14, 1981 [JP] Japan .................. 56-182782

[51] Int. Cl.³ ............................ G02B 5/14; G02B 5/16
[52] U.S. Cl. ........................ 350/96.32; 350/96.24; 362/32
[58] Field of Search ............. 350/96.10, 96.24, 96.32; 362/32

[56] References Cited

U.S. PATENT DOCUMENTS

| 3,491,245 | 1/1970 | Hardesty | 350/96.10 |
| 3,575,602 | 4/1971 | Townes et al. | 350/96.10 |
| 3,973,828 | 8/1976 | Onoda et al. | 350/96.32 |
| 4,151,582 | 4/1979 | Grunberger | 350/96.10 |
| 4,195,907 | 4/1980 | Zamja et al. | 350/96.32 |
| 4,297,000 | 10/1981 | Fries | 350/96.24 |
| 4,360,372 | 11/1982 | Maciejko | 350/96.24 |
| 4,411,490 | 10/1983 | Daniel | 350/96.10 |
| 4,422,719 | 12/1983 | Orcutt | 350/96.10 |

FOREIGN PATENT DOCUMENTS 8202604  8/1982  World Intel. Prop. Org. .................. 350/96.20

Primary Examiner—William L. Sikes
Assistant Examiner—Frank González
Attorney, Agent, or Firm—Jordan and Hamburg

[57] ABSTRACT

A tubular light transmitting element made of silica glass having an excellent light transmission efficiency and serving to transmit optical energy from a light source to a desired location. The tubular member defines a bore thereinside which is plugged at its light inlet and light outlet end portions each by a material whose refractive index is equal to or smaller than that of the tubular member.

26 Claims, 21 Drawing Figures

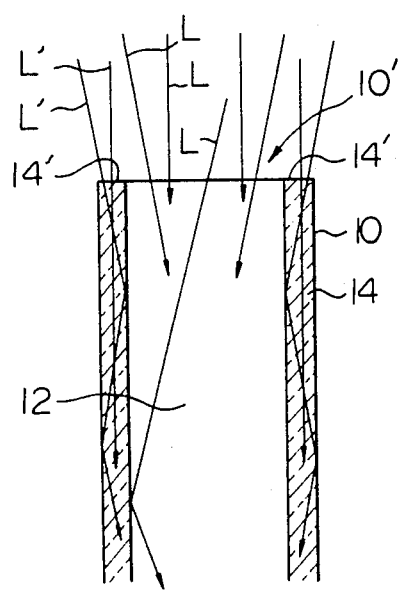
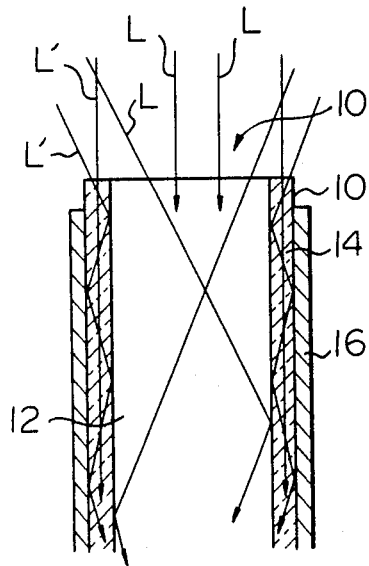
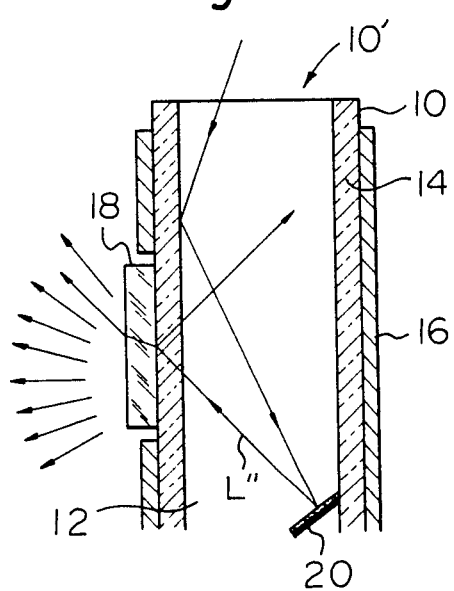
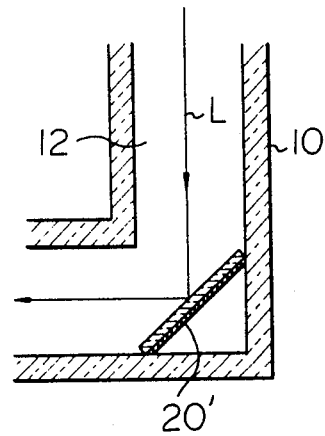

OPTICAL ENERGY COLLECTING AND TRANSMITTING APPARATUS USING TUBULAR LIGHT TRANSMITTING ELEMENT

BACKGROUND OF THE INVENTION

The present invention relates to a tubular light transmitting element capable of efficiently transferring optical energy such as solar energy converged by an optical system to any desired location. The present invention also relates to an optical energy collecting and transmitting apparatus using such a tubular element.

Various techniques have heretofore been proposed by the applicant in order to converge light from a light source such as sunlight into a light transmitting element by means of an optical system such as a lens, so that the light may be transmitted through the element to a desired place for the purpose of illumination or the like. In effectively introducing sunlight converged by the optical system and transmitting the light effectively with a minimum of loss throughout the transmission path, it is a prerequisite that the light transmitting element be made of a material which causes least attenuation to light and, therefore, features excellent transmissibility. Such materials may be typified by silica glass or fused silica, as well known to the art. Silica glass, however, is quite expensive and so will be a light transmitting element used in, for example, a sunlight supply device which the applicant has proposed and require a large number of such elements. Thus, the use of silica glass for light transmitting elements have so far failed to be readily practiced. Where sunlight is converged by a lens or like optical system, it is impossible to focus all the wavelength components thereof to one point due to the chromatic aberration with the result that the focussed image of the sun inevitably has certain largeness. Stated another way, it is quite difficult to introduce into an optical fiber all the solar energy converged by the optical system. Though a substantial amount of optical energy may be transferred efficiently if use is made of a light transmitting element having a larger diameter, the consumption of a large amount of expensive silica glass would render the cost prohibitive and make it difficult to achieve the efficient transmission of optical energy. Besides, the resulting optical fiber would be very heavy to make the transportation or installation thereof troublesome.

SUMMARY OF THE INVENTION

In one aspect of the present invention, a tubular light transmitting unit for transmitting optical energy from a light source to a desired location comprises a tubular member made of silica glass and a bore defined by the tubular member. The optical energy is thus transmitted through the tubular member and the bore.

In another aspect of the present invention, a tubular light transmitting assembly transmits optical energy from a light source to a desired location and has a plurality of tubular light transmitting units. Each of the tubular units comprises a tubular member made of silica glass and a bore defined by the tubular member, so that the optical energy is transmitted through the tubular member and the bore.

In a preferred embodiment of the present invention, the bore inside the tubular member is plugged at its light inlet and light outlet end portions each by a material whose refractive index is equal to or smaller than that of the tubular member.

It is an object of the present invention to provide an economical tubular light transmitting element which consumes a far smaller amount of expensive silica glass than conventional ones.

It is another object of the present invention to provide a tubular light transmitting element in which easier introduction of optical energy is achieved by increasing the light receiving area of a light transmitting member at an optical energy inlet portion thereof.

It is another object of the present invention to provide a tubular light transmitting element which efficiently transmits optical energy with hardly any loss.

It is another object of the present invention to provide a tubular light transmitting element which reduces the weight of and gives flexibility to a light transmitting member, thereby enhancing the ease of handling the element.

It is another object of the present invention to provide an optical energy collecting and transmitting apparatus constituted by the above-described tubular light transmitting elements.

It is another object of the present invention to provide a generally improved tubular light transmitting element and an optical energy collecting and transmitting apparatus using the tubular light transmitting element.

Other objects, together with the foregoing, are attained in the embodiments described in the following description and illustrated in the accompanying drawings.

BRIEF DESCRIPTION OF THE DRAWINGS

FIGS. 1-3 are sectional side elevations showing different embodiments of a tubular light transmitting element of the present invention;

FIGS. 4-6 are sectional side elevations showing some examples of arrangement of a tubular light transmitting element of the present invention;

FIG. 11b is a section along line X—X of FIG. 11a;

DESCRIPTION OF THE PREFERRED EMBODIMENTS

Figure 5:
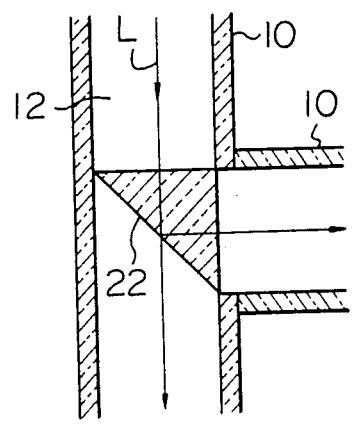

While the tubular light transmitting element and optical energy collecting and transferring device of the present invention is susceptible of numerous physical embodiments, depending upon the environment and requirements of use, substantial numbers of the herein shown and described embodiments have been made, tested and used, and all have performed in an eminently satisfactory manner.

Referring to FIG. 1 of the drawings, a tubular light transmitting element of the present invention is shown and generally designated by the reference numeral 10. The tubular element is made of silica glass. As previously described, silica glass is well known as a material which exhibits good transmissibility to light and has heretofore been used to constitute the cores of optical fibers and the like. Optical fibers, however, finds its application mainly to optical data transmission or the like and are very small in diameter. Therefore, optical fibers are unsuitable for use as an optical energy transferring medium which has to allow a large amount of optical energy to be efficiently introduced therein and transmitted therethrough. In light of this, the tubular element 10 of the present invention is designed such that convergent or parallel rays of light L provided by a lens or like optical system (not shown) becomes incident on a light input end of 10' of the tube 10 and propagates through the tube 10. Such a hollow configuration of the light transmitting element minimizes the consumption of silica glass, production cost and overall weight.

The tube 10 may be made of acryl or like material instead of the costly silica glass, as long as the alternative material permits optical energy to propagate only through the hollow interior 12 of the tube 10. In this case, the inner surface of the tube 10 will be mirror-finished. When light converged by a lens or the like is incident on the inlet end 10' of the tube 10, light rays L' around the convergent or parallel rays L become incident on an end face 14' of a side wall 14 of the tube 10 and then propagate through the side wall 14. If the transmissibility of the material which constitutes the side wall 14 is insufficient, the energy of light rays L' in the side wall 14 will be attenuated and fail to be utilized.

Referring to FIG. 2, another embodiment of the present invention is shown in which the tubular element 10 is surrounded by a clad layer 16. Besides the optical energy introduced in the side wall 14 of the tube 10, even the optical energy propagating through the bore 12 of the tube 10 may enter the side wall 14 in a location where the tube 10 is bent, for example. Thus, the clad layer 16 allows the tube 10 to successfully transmit such optical energy to a desired place without any wasteful emission to the outside. An additional function of the clad layer 16 is protecting the tube 10 which is made of silica glass. Also, retaining the silica glass tube 10 through the clad layer 16 will eliminate the release of the optical energy at the retaining section.

Referring to FIG. 3, the optical energy transmitted through the tube 10 may be picked out at a desired portion of the tube 10 by the illustrated arrangement. The tube 10 made of silica glass is provided on its side wall 14 with a light diffusing member 18 whose refractive index is larger than that of silica glass. With this arrangement, light passing through the side wall 14 of the tube 10 will be discharged to the outside through the light diffusing member 18. When it is desired to discharge a larger amount of optical energy to the outside, a mirror 20 may be located in the bore 12 or the side wall 14 of the tube 10 as illustrated so that the light L″ reflected by the mirror 20 becomes incident on the light diffusing member 18. While in FIG. 3 the member 18 and mirror 20 are shown as being applied to the tube 10 shown in FIG. 2, it will be readily understood that such a light receiving member and/or a mirror is applicable to the tube 10 shown in FIG. 1 as well.

Figure 6:
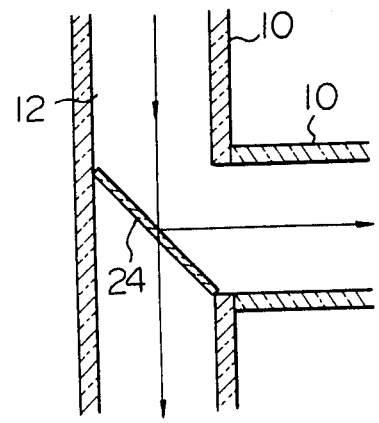

Referring to FIGS. 4-6, some exemplary arrangements of the tubular light transmitting element of the present invention are illustrated. In FIG. 4, the tube 10 is bent in generally L-shape and a mirror 20' is located at the L-shaped bend. In FIG. 5, the tube 10 is branched in generally T-shape while a prism 22 is positioned at the branching section. In FIG. 6, the tube 10 is also branched but provided with a half-mirror 24.

Figure 7:
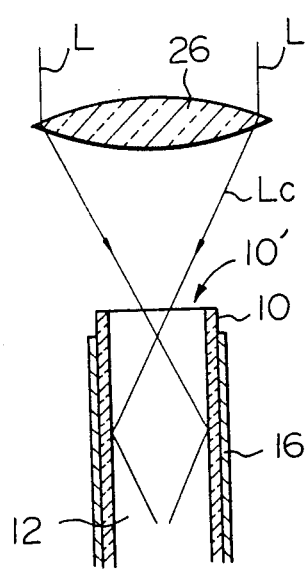
FIGS. 7-9 are views of some examples of an optical system which neighbors a light inlet end of a tubular light transmitting element of the present invention.
Figure 8:
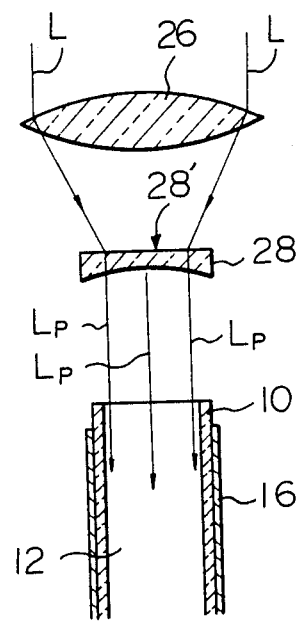

In each of the foregoing embodiments, the optical means for feeding convergent or parallel light rays L to the inlet end of the tube 10 may comprise a convex lens 26 as shown in FIG. 7 or the combination of a convex lens 26 and a concave lens 28 as shown in FIG. 8. The convex lens 26 in FIG. 7 causes rays of sun or the like to converge so that the convergent rays Lc become incident on the inlet end 10' of the tube 10. The convex lens 26 in FIG. 8 functions in the same manner as in FIG. 7 while the concave lens 28 transforms the convergent rays from the convex lens 26 into parallel rays Lp and feeds them to the tube 10. The combined lens system shown in FIG. 8 provides substantially parallel light rays which will be substantially totally reflected by the inner surface of the tube 10 and, therefore, its loss inside the tube 10 will be significantly reduced. Preferably, the light receiving surface 28' of the concave lens 28 is provided with a meniscus or flat configuration in order to minimize a loss due to reflection thereat.

Figure 9:
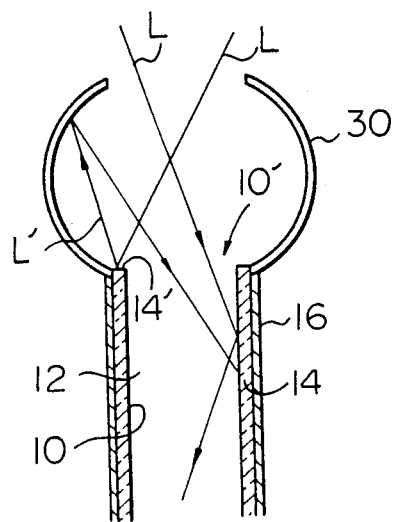

The lens system shown in FIG. 7 or 8 may be replaced by an annular mirror 30 as illustrated in FIG. 9. The annular mirror 30 is mounted on the inlet end 10' of the tube 10 so that the light rays L' reflected by, for example, the end face 14' of the side wall 14 at the tube inlet 10' may be reflected by the mirror 30 into the tube 10.

Figure 10:
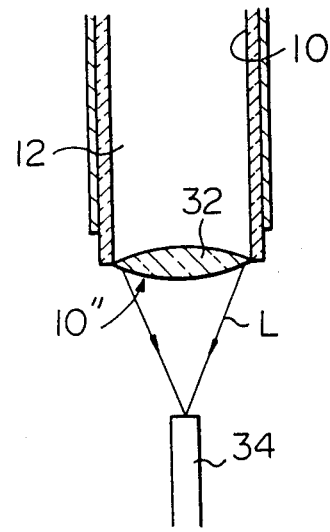
FIG. 10 is a view of an example of an optical system which neighbors a light outlet end.

In combination with the tube 10 shown in FIG. 8, a convex lens 32 may be located adjacent to a light outlet end 10″ of the tube 10 as indicated in FIG. 10. The convex lens 32 is adapted to focus parallel rays transmitted through the bore 12 of the tube 10 and causes the convergent rays L to enter a tubular light transmitting element or optical fiber 34 smaller in diameter than the tube 10. With this arrangement, optical energy can be transmitted using the tube or optical fiber 34 which is light weight and incostly. It will be clear that the convergent rays L from the convex lens 32 may be transformed into parallel rays by a concave lens (not shown) before introduced into the tube or optical fiber 34.

Figure 11A:
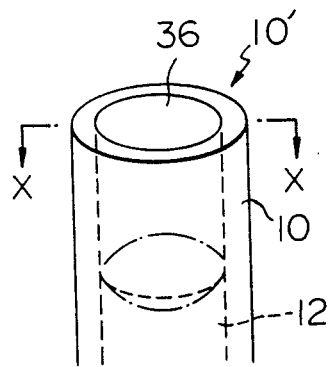
FIG. 11a is a view of another embodiment of the present invention.
Figure 11B:
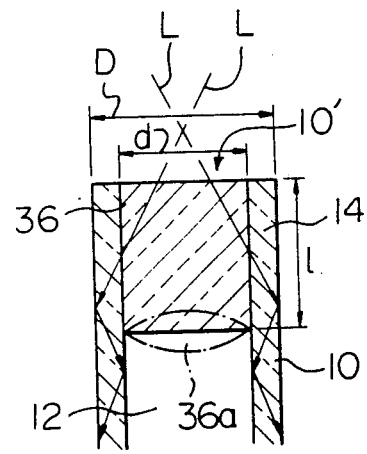

Referring to FIGS. 11a and 11b, another embodiment of the present invention is shown. FIG. 11a shows the inlet end 10' of the tube 10 while FIG. 11b is a section along line X—X of FIG. 11a. The tube 10 in this embodiment has its inlet end 10' stopped up by a transparent plug member 36 made of silica glass having a refractive index which is equal to or smaller than that of the tube 10. Light rays L converged by a lens or like optical system is conducted by the transparent plug 36 into the silica glass which forms the side wall 14 of the tube 10. The silica glass side wall 14, which is excellent in light transmission efficiency, transfers the input light rays L to any desired location. At the current stage of development, it is easy to produce a tube 10 which is 500 μm in outside diameter D and has a bore 12 dimensioned 400 μm in diameter d. The so dimensioned tube 10 requires silica glass consumption which is not more than about 36% of a solid tube for the same diameter D.

Figure 12:
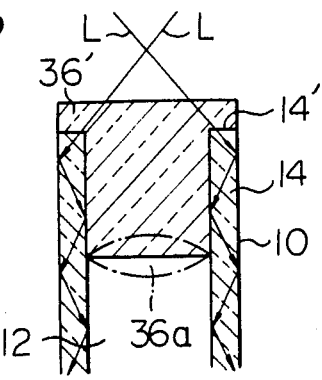
FIG. 12 is a section of a modification to the construction shown in FIGS. 11a and 11b.

Referring to FIG. 12, a modification to the embodiment shown in FIGS. 11a and 11b is indicated. As shown, the tube 10 is provided with a modified plug member 36' which not only stops the inlet end of the tube 10 but covers the end face 14' of the side wall 14. This arrangement, like that of FIGS. 11a and 11b, successfully guides the converged optical energy into the side wall 14 of the tube 10 which is made of silica glass.

In a preferred construction, the output end 36a of the plug 36 or 36' shown in FIGS. 11a and 11b or 12 is shaped flat as indicated by a solid line, concave as indicated by a dash-and-dot line or convex as indicated by a dash-and-dots line so that output rays from the surface 36a may be effectively directed into the side wall 14 of the tube 10, which is made of silica glass. This will reduce the amount of light propagating through the bore 12 and minimize the transmission loss, thereby promoting efficient transfer of the optical energy.

Figure 13A:
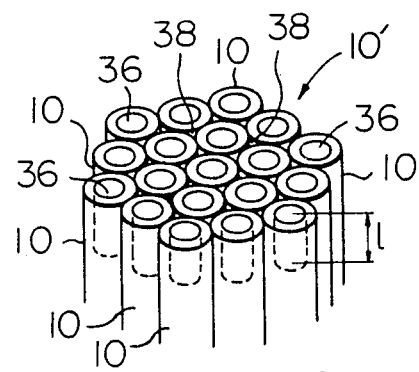
FIGS. 13a and 13b are views of an exemplary assembly constituted by tubular light transmitting elements of the present invention.
Figure 13B:
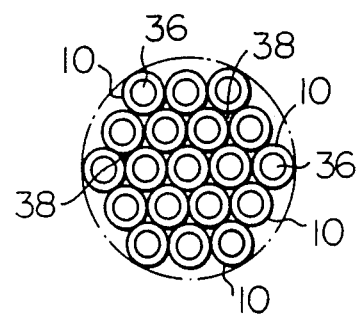

Referring to FIGS. 13a and 13b, there is shown an example of an assembly made up of tubular light transmitting elements of the present invention. As shown, a number of tubes 10 shown in FIGS. 11a and 11b or 12 are bundled up together at their inlet ends 10'. Gaps 38 left between adjacent tubes 10 are individually filled with a material exhibiting the same optical characteristics as the plugs 36 or 36', i.e., transparent silica glass whose refractive index is equal to or smaller than that of the tubes 10. Each of the fillers extends over a length substantially common to the length l of the plug 36 or 36' from the inlet end of the tube 10. It will be seen that the fillers of silica glass give the assembly a wider light receiving area at the inlet end and, thereby, allows the high density optical energy converged by the lens system to be more effectively introduced into the tubes 10. The fillers in the gaps 38 also serve to prevent the tubes 10 from being chipped off while the inlet end 10' of the tube bundle 10 is machined to a flat surface. Additionally, the fillers check small particles of dust which would otherwise enter the gaps 38.

Figure 14:
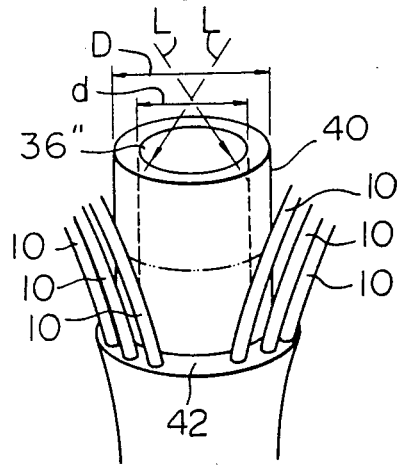
FIG. 14 is a view of another form of the assembly of the tubular light transmitting elements.

Referring to FIG. 14, another possible form of the tube assembly is illustrated. A tubular light transmitting element 40 has an outside diameter D of about 10 mm and is formed with a bore which is about 8 mm in diameter d, thus being far larger in diameter than the tube 10 in any of the foregoing embodiments. In this assembly, the light guided by the narrow tubes or conventional optical fibers 10 can be introduced into the large diameter tube 40 through the side wall of the latter. Hence, a large amount of optical energy can be effectively transferred through the side wall of the tube 40 which is made of silica glass. The tubes or optical fibers 10 are mounted to the outer periphery of the tube 40 through a connector member 42 which is formed of a transparent material having a refractive index equal to or smaller than that of the tube 40. If necessary, the outer periphery of the connector 42 may be covered with a thin reflector layer in order to prevent the light introduced through the connector 42 from leaking to the outside.

Figure 15:
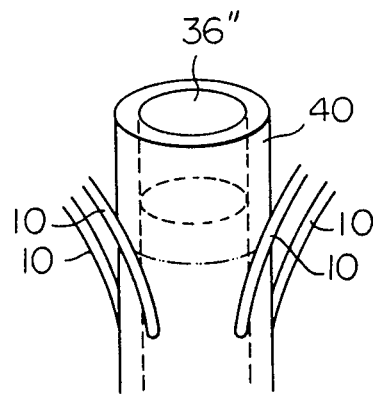
FIG. 15 is a view of a modification to the construction shown in FIG. 14.

A modified form of the assembly shown in FIG. 14 is indicated in FIG. 15. As shown, the smaller tubes or optical fibers 10 are directly connected to the outer periphery of the larger tube 40 by means of an optical adhesive or the like. This assembly is comparable with that of FIG. 14 in the ability of conducting a large amount of optical energy into the side wall of the larger tube 40 made of silica glass and, thereby, efficiently transferring the optical energy therethrough.

Figure 16:
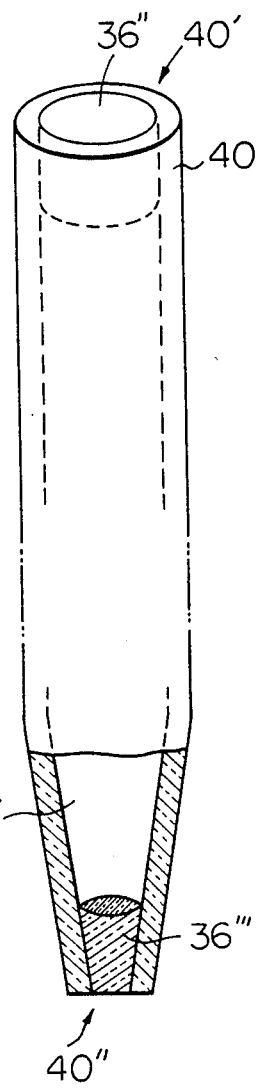
FIG. 16 is a view of another embodiment of the present invention.
Figure 17A:
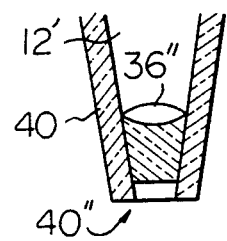
FIGS. 17a and 17b are views of a modified form of the outlet end of the tubular member shown in FIG. 16.
Figure 17B:
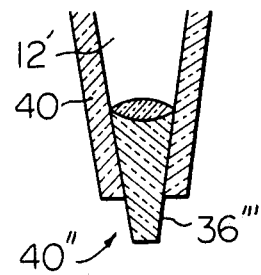
Figure 18:
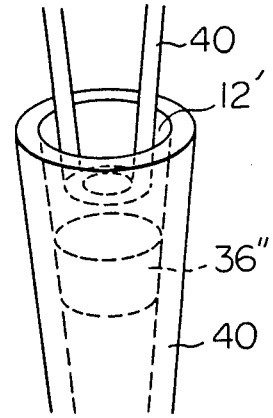
FIG. 18 is a view of the tubular element shown in FIG. 16 which is in an exemplary state of use.

While the larger tube 40 may have an even diameter throughout its length from the inlet end 40' to the outlet end 40", it may be provided with an outlet end 40" which is tapered away from the inlet end 40' as illustrated in FIG. 16. In FIG. 16, light rays converged by a lens system are effectively introduced in the tube 40 through the inlet end 40' and then progressively converged by the side wall of the tube 40 which is made of silica glass. Finally, the converged light is emitted from the tapered outlet end 40" with a high energy density. The tapered outlet end 40" of the tube 40 may be stopped up by a plug member 36''' having a refractive index which is equal to or smaller than that of the tube 40. The plug 36''' will effectively guide the light propagated through the bore 12' into the side wall of the tube 40. The refractive index of the plug 36''' may be selected to the larger than that of the tube 40 in order to guide the light transmitted through the side wall of the tube 40 to the plug 36''' and, thereby, further increase the optical energy density available at the tube outlet end 40". Where the refractive index of the plug 36''' is equal to or smaller than that of the tube 40, the plug 36''' fit in the tube 40 may be so positioned as to terminate short of the outermost end face of the tube 40 as illustrated in FIG. 17a, so that light rays can be converged to the side wall of the tube 40 and effectively discharged from the end face. Where the refractive index of the plug 36''' is larger than that of the tube 40, the plug 36''' may protrude from the outlet end of the tube 40 as indicated in FIG. 17b in order to further effectively release the light which is converged to the plug 36'''. As shown in FIG. 18, a plurality of such tubes 40 having tapered outlet ends 40''' may be connected in series fitting the outlet end 40" of one in the inlet end 40' of another, the diameters of the inlet ends 40' and outlet ends 40" being progressively reduced. This multiple tube connection will make the diameter of the final outlet end 40" very small and, thus, realize a far higher optical energy density thereat. When introduced into the smaller tubes 10 in any one of the embodiments described, the light so converged to have a high density and, therefore, its energy can be transferred far more effectively.

Various modifications will become possible for those skilled in the art after receiving teachings of the present disclosure without departing from the scope thereof.

What is claimed is:

1. A tubular light transmitting unit for transmitting optical energy from a light source to a desired location, comprising:
   a tubular member made of silica glass;
   a bore defined by said tubular member; and
   a transparent plug member which stops up at least one of a light inlet end portion and a light outlet end portion of the tubular member, whereby the optical energy is transmitted through the tubular member and the bore.

2. A tubular light transmitting unit as claimed in claim 1, wherein the transparent plug member has a refractive index which is equal to the refractive index of the tubular member.

3. A tubular light transmitting unit as claimed in claim 1, wherein the transparent plug member has a refractive index which is smaller than the refractive index of the tubular member.

4. A tubular light transmitting unit as claimed in claim 2 or 3, wherein an end face of the plug member positioned inside the bore of the unit is shaped to have one of flat, convex and concave configurations.

5. A tubular light transmitting unit as claimed in claim 1, wherein the diameter of the tubular member is smaller at the light outlet end portion than at the light inlet end portion.

6. A tubular light transmitting unit as claimed in claim 1, wherein the light source is the sun.

7. A tubular light transmitting unit as claimed in claim 1, further comprising a light diffusing member mounted on the outer periphery of the tubular member to diffuse the optical energy to the outside of the tubular member, said ight diffusing member having a refractive index which is larger than the refractive index of the tubular member.

8. A tubular light transmitting unit as claimed in claim 7, further comprising a reflector member mounted on the inner periphery of the tubular member to reflect the optical energy toward the light diffusing member.

9. A tubular light transmitting unit as claimed in claim 1, further comprising a clad layer member covering the outer periphery of the tubular member.

10. A tubular light transmitting unit as claimed in claim 9, further comprising a light diffusing member mounted on the outer wall of the tubular member to diffuse the optical energy to the outside of the tubular member, said light diffusing member having a refractive index which is larger than the refractive index of the tubular member.

11. A tubular light transmitting unit as claimed in claim 10, further comprising a reflector member mounted on the inner periphery of the tubular member to reflect the optical energy toward the light diffusing member.

12. A tubular light transmitting unit as claimed in claim 1, further comprising an optical system for converging the optical energy from the light source and introducing the converged optical energy into the bore of the tubular member.

13. A tubular light transmitting unit as claimed in claim 12, wherein the optical system comprises a convex lens.

14. A tubular light transmitting unit as claimed in claim 12, wherein the optical system comprises a convex lens and a concave lens for transforming the optical energy converged by said convex lens into parallel rays.

15. A tubular light transmitting unit as claimed in claim 14, wherein the surface of the concave lens for receiving light is shaped as a convex meniscus.

16. A tubular light transmitting unit as claimed in claim 14, wherein the surface of the concave lens for receiving light is formed flat.

17. A tubular light transmitting unit as claimed in claim 1, further comprising a mirror for reflecting the optical energy reflected by the tubular member toward the bore in the light inlet portion of the tubular member.

18. A tubular light transmitting unit as claimed in claim 1, further comprising a light transmitting member optically connected with the unit at the light outlet end portion, said light transmitting member being smaller in diameter than the unit.

19. A tubular light transmitting unit as claimed in claim 18, further comprising a convex lens located in the light outlet end portion of the unit to converge the optical energy from the light outlet end portion and introduce the converged optical energy into the light transmitting member.

20. A tubular light transmitting unit as claimed in claim 19, further comprising a concave lens for transforming the optical energy converged by the convex lens into parallel rays and introducing the parallel rays into the light transmitting member.

21. A tubular light transmitting assembly for transmitting optical energy from a light source to a desired location and having a plurality of tubular light transmitting units, each of the units comprising:
 a tubular member made of silica glass,
 a bore defined by said tubular member; and
 a transparent plug member which stops up one end of the bore, whereby the optical energy is transmitted through the tubular member and the bore.

22. A tubular light transmitting assembly as claimed in claim 21, wherein at least one end of the plurality of tubular light transmitting units are bundled up together.

23. A tubular light transmitting assembly as claimed in claim 22, wherein said assembly further comprises transparent plug members which fill spaces left between adjacent tubular members at one end of the assembly.

24. A tubular light transmitting assembly as claimed in claim 21 or 23, wherein the plug members have a refractive index which is equal to the refractive index of the tubular members.

25. A tubular light transmitting assembly as claimed in claim 21 or 23, wherein the plug members have a refractive index which is smaller than the refractive index of the tubular members.

26. A tubular light transmitting unit for transmitting optical energy from a light source to a desired location, comprising:
 a tubular member made of silica glass;
 a bore defined by said tubular member; and
 a plurality of optical fibers which are individuallly connected with the outer periphery of the tubular member to guide the optical energy into the bore through said outer periphery, whereby the optical energy is transmitted through the tubular member and the bore.

* * * * *